United States Patent
Lin et al.

(10) Patent No.: US 10,592,410 B2
(45) Date of Patent: Mar. 17, 2020

(54) BACKUP MECHANISM OF WRITING SEQUENTIAL DATA TO SINGLE-LEVEL CELL BUFFER AND MULTI-LEVEL CELL BUFFER

(71) Applicant: Silicon Motion, Inc., Jhubei (TW)

(72) Inventors: Wen-Sheng Lin, Kaohsiung (TW); Yu-Da Chen, Taipei (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 16/039,740

(22) Filed: Jul. 19, 2018

(65) Prior Publication Data

US 2019/0095321 A1 Mar. 28, 2019

(30) Foreign Application Priority Data

Sep. 28, 2017 (TW) .............................. 106133362 A

(51) Int. Cl.
*G06F 12/02* (2006.01)
*G06F 12/1009* (2016.01)
*G06F 3/06* (2006.01)
*G06F 11/07* (2006.01)

(52) U.S. Cl.
CPC .......... *G06F 12/0246* (2013.01); *G06F 3/061* (2013.01); *G06F 3/068* (2013.01); *G06F 3/0619* (2013.01); *G06F 3/0656* (2013.01); *G06F 3/0659* (2013.01); *G06F 3/0679* (2013.01); *G06F 11/07* (2013.01); *G06F 12/1009* (2013.01); *G06F 2212/7201* (2013.01); *G06F 2212/7203* (2013.01)

(58) Field of Classification Search
CPC ............. G06F 12/0246; G06F 12/1009; G06F 3/0656; G06F 3/061; G06F 3/0679; G06F 3/0659; G06F 2212/7203; G06F 2212/7201; G06F 3/0619; G06F 3/068; G06F 11/07; G06F 2201/81; G06F 11/1451; G11C 16/10; G11C 11/5628; G11C 2211/5641; G11C 5/143; G11C 16/20; G11C 7/20; G11C 2029/0409; G11C 29/52; G11C 29/72
USPC .................................. 711/103, 117, 151, 162
See application file for complete search history.

(56) References Cited

U.S. PATENT DOCUMENTS

| 8,566,504 B2 | 10/2013 | Traister | |
| 9,619,380 B2 | 4/2017 | Yeh | |
| 2009/0327591 A1* | 12/2009 | Moshayedi | G06F 11/1441 711/103 |
| 2011/0010488 A1* | 1/2011 | Aszmann | G06F 3/0608 711/103 |

(Continued)

*Primary Examiner* — Hong C Kim
(74) *Attorney, Agent, or Firm* — Wang Law Firm, Inc.

(57) ABSTRACT

A data storage device includes a memory device and a controller. The memory device includes a first buffer, a second buffer, and a backup memory block. The first buffer is an MLC block and the second buffer is an SLC block. The controller is coupled to the memory device, receives a write command to write predetermined data in the memory device and determines whether the predetermined data has to be written into different buffers. When the controller determines that the predetermined data has to be written into different buffers, the controller writes a portion of the predetermined data that has been written in one or more predetermined pages of the first buffer into the backup memory block.

11 Claims, 5 Drawing Sheets

(56) References Cited

U.S. PATENT DOCUMENTS

| | | | |
|---|---|---|---|
| 2013/0254458 A1* | 9/2013 | Pittelko | G06F 12/02 |
| | | | 711/103 |
| 2016/0092129 A1* | 3/2016 | Agarwal | G06F 3/0619 |
| | | | 714/764 |
| 2016/0179430 A1* | 6/2016 | Kong | G06F 3/0631 |
| | | | 711/102 |
| 2016/0364337 A1* | 12/2016 | Hale | G06F 12/0897 |
| 2017/0038969 A1* | 2/2017 | Choi | G06F 3/061 |
| 2017/0177235 A1* | 6/2017 | Nishikubo | G06F 3/0659 |

* cited by examiner

BACKUP MECHANISM OF WRITING SEQUENTIAL DATA TO SINGLE-LEVEL CELL BUFFER AND MULTI-LEVEL CELL BUFFER

CROSS REFERENCE TO RELATED APPLICATIONS

This Application claims priority of Taiwan Patent Application No. 106133362, filed on Sep. 28, 2017, the entirety of which is incorporated by reference herein.

BACKGROUND OF THE INVENTION

Field of the Invention

The invention relates to a data processing method suitable for a flash memory device and capable of preventing damage to the data stored in the memory device when a sudden power-off occurs during a write operation of the memory device.

Description of the Related Art

With the rapid growth of data storage technology in recent years, many data storage devices—such as memory cards manufactured in compliance with the SD/MMC standards, CF standards, MS standards or XD standards, as well as solid state hard drives, Embedded Multi Media Cards (eMMC) and Universal Flash Storage (UFS)—have been used widely for a variety of purposes. Therefore, effective control of access to these data storage devices is an important issue.

Generally, if a sudden power-off occurs during the editing of a flash memory device, the data being written into the memory device at the time of the power-off may become damaged. When data has been damaged and cannot be corrected by an error correction code, regardless of whether the remaining data is still correct, all of the data corresponding to the same write command should be discarded. This drastically affects the performance of the memory device. To solve this problem, a data processing method is proposed to avoid causing damage to the data stored in the memory device when a sudden power-off occurs during a write operation of the memory device.

BRIEF SUMMARY OF THE INVENTION

A data storage device and methods for writing data into a memory device are provided. An exemplary embodiment of a data storage device comprises a memory device and a controller. The memory device comprises a first buffer, a second buffer and a backup memory block. The first buffer is an MLC block and the second buffer is an SLC block. The controller is coupled to the memory device, and configured to receive a write command, to write predetermined data in the memory device, and to determine whether the predetermined data has to be written into different buffers. When the controller determines that the predetermined data has to be written into different buffers, the controller is configured to write a portion of the predetermined data that has been written in one or more predetermined pages of the first buffer into the backup memory block An exemplary embodiment of a data storage device comprises a memory device and a controller. The memory device comprises a first buffer, a second buffer, and a backup memory block. The first buffer is an MLC block and the second buffer is an SLC block. The controller is coupled to the memory device. The controller is configured to receive a write command, to write predetermined data in the memory device, and to determine whether the predetermined data has to be written into the first buffer discontinuously. When the controller determines that the predetermined data has to be written into the first buffer discontinuously, the controller is configured to write a portion of the predetermined data that has been written in one or more predetermined pages of the first buffer into the backup memory block.

An exemplary embodiment of a method for writing data into a memory device, suitable for a data storage device comprising a memory device and a controller, wherein the memory device comprises a first buffer, a second buffer and a backup memory block, the first buffer is an MLC block and the second buffer is an SLC block, wherein the method comprises: performing a write operation based on a write command to write predetermined data into the memory device. The step of performing the write operation based on the write command further comprises: during the write operation, writing a portion of the predetermined data that has been written in one or more predetermined pages of the first buffer into the backup memory block.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. It should be understood that the following embodiments may be implemented by software, hardware, firmware, or any combination of the above.

Figure 1A:
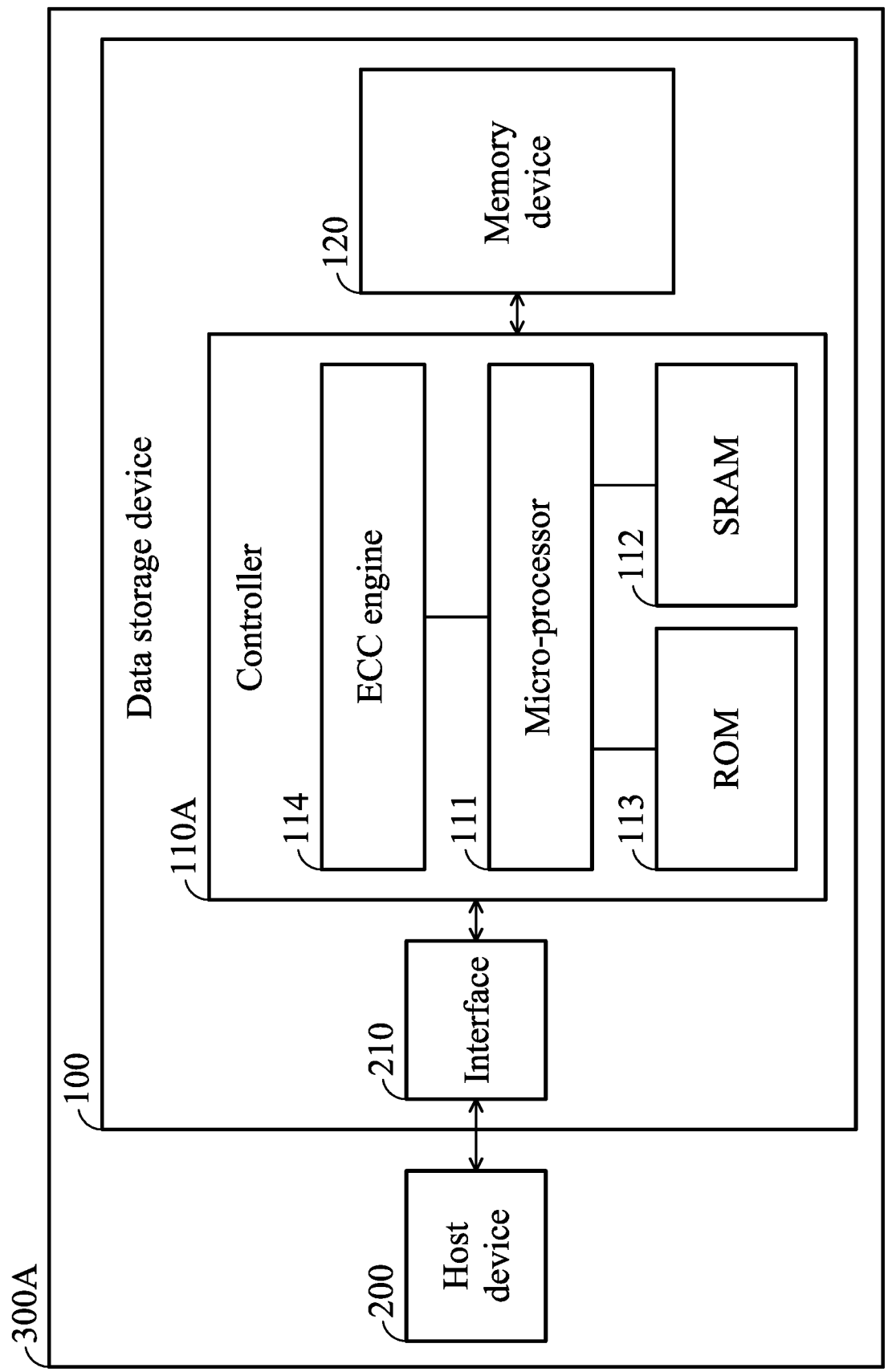
FIG. 1A shows an exemplary block diagram of an electronic device according to an embodiment of the invention.

FIG. 1A shows an exemplary block diagram of an electronic device according to an embodiment of the invention. The electronic device 300A may comprise a data storage device 100 and a host device 200. The electronic device 300A may be a mobile device, such as a smartphone, a smart watch, a tablet computer, etc., but the invention should not be limited thereto.

According to an embodiment of the invention, the data storage device 100 may comprise a controller 110A and a memory device 120. The controller 110A may comprise a micro-processor 111, a Static Random Access Memory (SRAM) 112, a Read Only Memory (ROM) 113 and an Error Correction Code (ECC) engine 114. The memory device 120 may comprise one or more non-volatile memory devices, such as a flash memory.

The micro-processor 111 may perform calculations and control the operation of circuits and devices within the controller 110A. The SRAM 112 and the ROM 113 are configured to store system data. The ECC engine 114 is configured to generate a parity check bit according to the data content to be written to the memory device.

The host device 200 and the data storage device 100 are connected to each other via a predetermined interface 210. For example, when the data storage device 100 conforms to the Universal Flash Storage (UFS) standards, the interface 210 may be a UFS interface, and the data storage device 100 may be connected to the host device 200 through the interface 210. In another example, when the data storage device 100 conforms to the eMMC standards, the interface 210 may be an MMC interface, and the data storage device 100 may be connected to the host device 200 through the interface 210

Figure 1B:
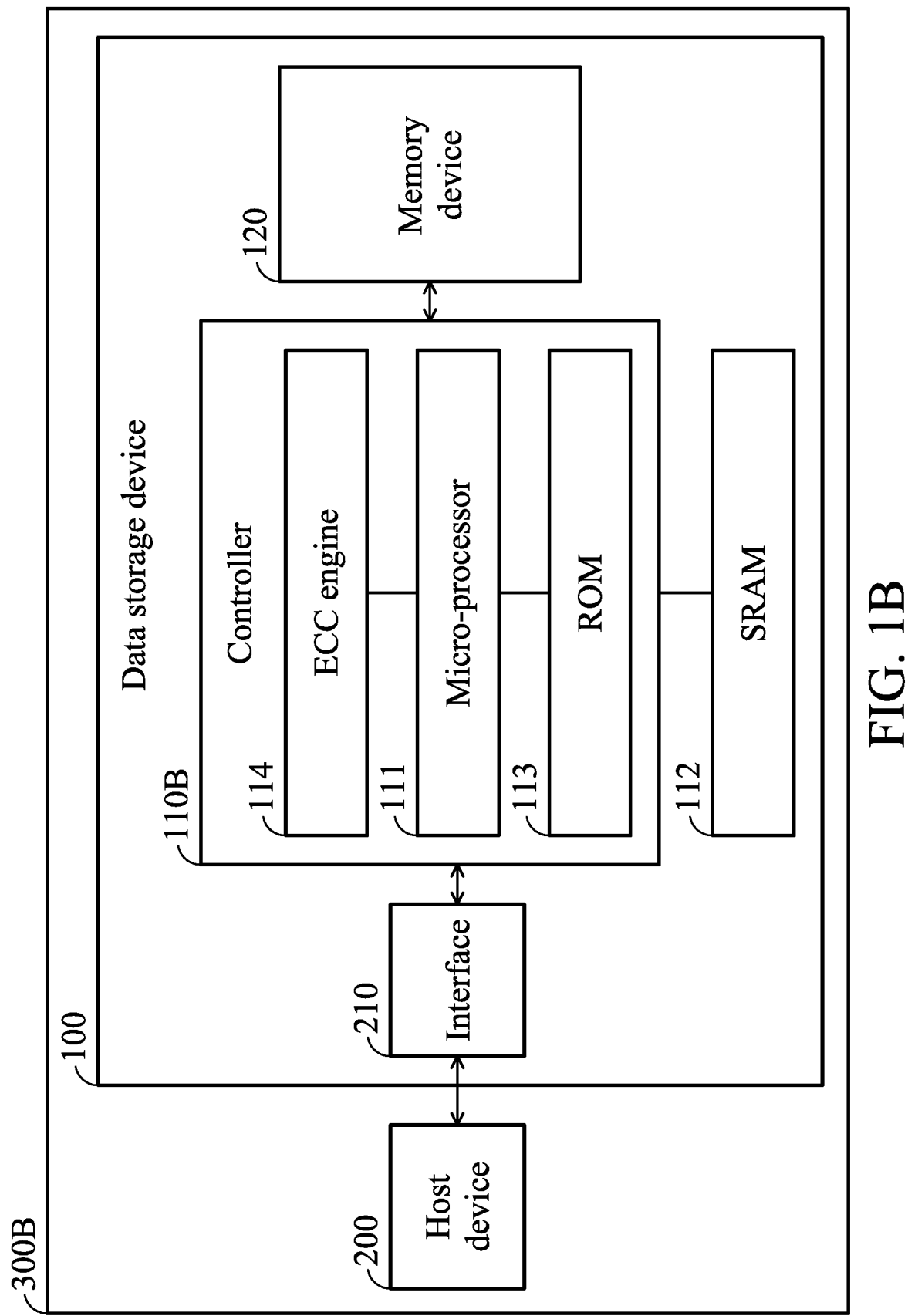
FIG. 1B shows an exemplary block diagram of an electronic device according to another embodiment of the invention.

FIG. 1B shows a block diagram of an electronic device 300B according to another embodiment of the invention. In this embodiment, the SRAM 112 is configured outside of the controller 110B and is coupled to the controller 110B.

It should be noted that, to simplify the description, FIG. 1A and FIG. 1B only show the elements related to the invention, and FIG. 1A and FIG. 1B only show two kinds of a plurality of architectures to which the invention can be applied. However, the implementation of the invention is not limited to the elements and architectures shown in FIG. 1A and FIG. 1B.

According to an embodiment of the invention, the memory device 120 may comprise a plurality of memory blocks. The memory blocks may further be divided into a plurality of Single Level Cell (SLC) blocks and a plurality of Multiple Level Cell (MLC) blocks. Each memory cell in the SLC block stores one bit data, and each memory cell in the MLC block stores multiple bits of data. For example, according to an embodiment of the invention, each memory cell in the MLC block stores two bits of data.

Each memory block may comprise a plurality of pages. Generally, in the flash memory device, one page is a minimum data block unit for a write task. The size of a physical page is fixed, and the size of a logical page can be flexibly designed according to the firmware programming requirements.

Generally, in order to make the programing of the MLC block stable, for every programming, multiple pages of data (for example, two physical pages of data) have to be written into the MLC block. Therefore, the SLC blocks and a portion of MLC blocks of the memory device may be utilized as cache memory, or called buffer, for buffering data. When the utilization of the buffer reaches a certain level, the controller 110A/110B further writes the data stored in the buffer into another MLC block or updates the MLC block that was used as a buffer into a data block. In this way, the memory space of the buffer can be released and used again.

The invention is applied to the data storage device with a two-buffer structure. According to an embodiment of the invention, the memory device 120 may comprise a first buffer Buffer_1 and a second buffer Buffer_2. The first buffer Buffer_1 may comprise one or more MLC blocks, and the second buffer Buffer_2 may comprise one or more SLC blocks. The memory device 120 may further comprise a backup memory block Backup_Blk. The backup memory block Backup_Blk may be an SLC block for backing up one or more predetermined pages of data for the first buffer Buffer_1. In other embodiments of the invention, the backup memory block Backup_Blk may be an MLC block, and the invention should not be limited thereto.

The first buffer Buffer_1 is configured to store consecutive or large data, for example, to store data of a plurality of consecutive logical pages. The second buffer Buffer_2 is configured to store random or small data. According to an embodiment of the invention, the controller 110A/110B may determine whether to write the data into the first buffer Buffer_1 or the second buffer Buffer_2 according to the size of data indicated to be written in a write command. For example, when the size of data to be written is greater than or equal to a threshold value (for example, 16 K bytes, or the size of a physical page), or is a an integer multiple of the threshold value, the controller 110A/110B may determine to write the data (or a portion of the data) into the first buffer Buffer_1. On the contrary, when the size of data to be written is smaller than the threshold value, the controller 110A/110B may determine to write the data into the second buffer Buffer_2.

In addition, according to an embodiment of the invention, the controller 110A/110B receives a write command WCMD to write predetermined data DATA to the memory device 120 from the host device 200. The predetermined data DATA may comprise a plurality of pages (for example, a plurality of logical pages) of data. For example, the predetermined data DATA may be the data in the host page HP0~HP10 of the host device 200, where one host page may be set as the data unit for one access operation of the host device 200. For example, when the size of one physical page is 16 K bytes, the size of one host page may be set to 4 K bytes. Therefore, in this embodiment, since the size of the predetermined data DATA is greater than or equal to the threshold value (for example, 16 K bytes), the controller 110A/110B may determine to write the predetermined data DATA (or a portion of the predetermined data DATA) into the first buffer Buffer_1.

According to another embodiment of the invention, besides the size of data, the controller 110A/110B may further determine whether to write the data into the first buffer Buffer_1 or the second buffer Buffer_2 according to the start host page number of the predetermined data DATA. According to an embodiment of the invention, since a specific number (N) of host pages have to be consecutively written in the memory device when executing the same write command WCMD, when the start host page number is an integer multiple of the specific number (N) or the remainder obtained when the start host page number being divided by the specific number (N) is 0, and when the size of the predetermined data DATA is greater than or equal to the threshold value (for example, the size of one physical page) and is an integer multiple of the threshold value, the controller 110A/110B may determine to write the data into the first buffer Buffer_1. Otherwise, the controller 110A/110B may determine to write the data into the second buffer Buffer_2.

According to an embodiment of the invention, N is a positive integer, and the specific number N is related to the size of a logical page and the size of a physical page. According to an embodiment of the invention, when the threshold value is set to the size of a physical page, and the size of the host page is set to 4 K bytes, since the size of one physical page is 4 times of the size of one host page, the specific number N may be set to 4 (that is, a ratio of one physical page to one host page).

For example, when the predetermined data DATA to be written to the memory device 120 is HP0~HP3, since the remainder of dividing the start host page number 0 by 4 is 0, and the size of the predetermined data DATA is equal to one physical page (that is, 4 host pages), the controller 110A/110B will determine to write the data into the first buffer Buffer_1. In another example, when the predetermined data DATA to be written to the memory device 120 is HP1~HP4, even if the size of the predetermined data DATA is greater than or equal to the threshold value, since the start host page number 1 is not an integer multiple of 4 (that is, the remainder of dividing the start host page number 1 by 4 is not 0), the controller 110A/110B will determine to write the data into the second buffer Buffer_2. In addition, when the predetermined data DATA to be written to the memory device 120 is HP0~HP2, since the size of the predetermined data DATA is smaller than the threshold value, the controller 110A/110B will determine to write the data into the second buffer Buffer_2. When the predetermined data DATA to be written to the memory device 120 is HP0~HP5, the controller 110A/110B will determine to write the data HP0~HP3 into the first buffer Buffer_1, and write the data HP4~HP5 into the second buffer Buffer_2.

In a data storage device with a dual-buffer structure, different priorities should be given to the buffers, so that when both buffers store data corresponding to the same logical page (directing to the same logical page), a determination can be made as to which buffer the valid data is stored in. According to an embodiment of the invention, the priority of the second buffer Buffer_2 is set to be higher than the priority of the first buffer Buffer_1. In this manner, when both of the buffers store the data directing to the same logical page, the controller 110A/110B can determine that the data stored in the second buffer Buffer_2 is valid data.

Besides taking the size of the predetermined data DATA to be written and/or the start host page number into account in a determination of which buffer the data should be written into, the controller 110A/110B may further considering whether one or more pages (that is, a logical page, such as the host page) of the predetermined data DATA has already been stored in the second buffer Buffer_2 when the write command WCMD is executed, based on the priority setting discussed above. If the second buffer Buffer_2 has already stored the data corresponding to one or more pages of the predetermined data DATA, even though the controller 110A/110B may determine to write the predetermined data DATA into the first buffer Buffer_1 when considering the size of the predetermined data DATA or further the start host page number, since the second buffer Buffer_2 has a higher priority, the controller 110A/110B will eventually determine the page of the predetermined data DATA that has to be written into the second buffer Buffer_2.

For example, suppose that the second buffer Buffer_2 has already stored the data corresponding to the host page HP8 of the predetermined data HP0~HP15: The controller 110A/110B determines to write the host pages HP0~HP7 into the first buffer Buffer_1, write the host pages HP8~HP11 into the second buffer Buffer_2, and then write the host pages HP12~HP15 into the first buffer Buffer_1. In this embodiment, although the remainder after the start host page number (8) of the host pages HP8~HP11 is divided by 4 is 0, and the size of the host pages HP8~HP11 is equal to one physical page (that is, 4 host pages), since the second buffer Buffer_2 has already stored the data corresponding to the host page HP8, the controller 110A/110B will still decide to write the data corresponding to the host pages HP8~HP11 into the second buffer Buffer_2 instead of the first buffer Buffer_1.

Note that in this embodiment, because a specific number (N) of host pages have to be consecutively written in the memory device when executing the same write command WCMD (for example, 4 host pages have to be consecutively written in the memory device when executing a write command WCMD), if the second buffer Buffer_2 has already stored the data corresponding to the host page HP8, four consecutive host pages comprising the host page HP 8 will be written into the second buffer Buffer_2.

According to an embodiment of the invention, the controller 110A/110B may determine whether one or more pages of the predetermined data have been stored in the second buffer Buffer_2 by looking it up in a predetermined table. The predetermined table may be configured to record the address of the logical page (for example, the host page discussed above) to which the data stored in each physical page in the first buffer Buffer_1 and the second buffer Buffer_2 is directed. Therefore, the controller 110A/110B may determine whether the data stored in each physical page in the second buffer Buffer_2 is directed to the address of the host pages HP 0~HP 15 of the predetermined data DATA based on the predetermined table. If so, it means that at least one page of the predetermined data DATA has been stored in the second buffer Buffer_2.

According to an embodiment of the invention, when the size of the predetermined data DATA is greater than the threshold value, and when at least one page of the predetermined data DATA has been stored in the second buffer Buffer_2, the controller 110A/110B may determine that the predetermined data DATA has to be written into different buffers. In other words, when the size of the predetermined data DATA is greater than the threshold value and when at least one page of the predetermined data DATA has been stored in the second buffer Buffer_2, the controller 110A/110B may determine that the predetermined data has to be written into the first buffer Buffer_1 discontinuously. This is because a portion of the predetermined data DATA has to be written into the second buffer Buffer_2. Therefore, during the write operation of a write command WCMD, the pages of the predetermined data DATA will not be continuously written into the first buffer Buffer_1.

According to another embodiment of the invention, when the controller 110A/110B determines that at least a portion of the predetermined data DATA has to be written into the first buffer Buffer_1, and at least one page of the remaining portion of the predetermined data DATA has already stored in the second buffer Buffer_2, the controller 110A/110B may determine that the predetermined data DATA has to be written into different buffers. For example, when the size of the predetermined data DATA is greater than the threshold value such that at least a portion of consecutive pages will be written into the first buffer Buffer_1 and at least one of the remaining pages has to be written into the second buffer Buffer_2 since the data of the at least one of the remaining pages has already been written in the second buffer Buffer_2, the controller 110A/110B may determine that the predetermined data has to be written into the first buffer Buffer_1 discontinuously. This is because that a portion of the predetermined data DATA has to be written into the second buffer Buffer_2. Therefore, during the write operation of a write command WCMD, the pages of the predetermined data DATA will not be continuously written into the first buffer Buffer_1. Here, the so-called "consecutive pages" comprises N consecutive pages with the start page number being an integer multiple of the specific number (N), or having a remainder of 0 when the start page number is divided by the specific number (N)).

The controller 110A/110B is configured to write a portion of the predetermined data that has been written in one or more predetermined pages of the first buffer Buffer_1 into the backup memory block Backup_Blk when the controller 110A/110B determines that the predetermined data DATA has to be written into different buffers, or when it determines that the predetermined data has to be discontinuously written into the first buffer Buffer_1 (or, when the pages of the predetermined data DATA will not be written into the first buffer Buffer_1 in a consecutive manner), according to an embodiment of the invention.

In an embodiment of the invention, the controller 110A/110B has to back up the data stored in the pair page(s) of a portion of the predetermined data DATA before the controller 110A/110B writes the portion of the predetermined data DATA if the controller 110A/110B determines that the predetermined data DATA to be written according to the same write command WCMD has to be written into different buffers. For example, a first portion of the predetermined data DATA has to be written into the first buffer Buffer_1, then a second portion of the predetermined data DATA has to be written into the second buffer Buffer_2, and then a third portion of the predetermined data DATA has to be written into the first buffer Buffer_1 again, the controller 110A/110B determines that the predetermined data DATA to be written according to the same write command WCMD has to be written into different buffers. Therefore, continuing this example, the controller 110A/110B is configured to write the data that has been written in one or more predetermined pages (which are the pair pages of the third portion of data) of the first buffer Buffer_1 into the backup memory block Backup_Blk, in an embodiment of the invention.

The purpose of writing a portion of the predetermined data that has already been written in one or more predetermined pages of the first buffer Buffer_1 into the backup memory block Backup_Blk is to avoid causing damage to the data in the memory device when a sudden power-off occurs during the write operation. For example, when a sudden power-off occurs while the third portion of data is being written, the pair page (which may belong to the first portion of data and may have already been written in the first buffer Buffer_1) of a page of the third portion of data currently being programmed may also be damaged. If the pair page in the first portion of data is damaged, when the controller 110A/110B scans the buffer to check whether the data stored in the buffer was damaged during an initialization procedure as the data storage device is powered up and when the controller 110A/110B finds that some error has occurred in some page in the first portion of data but the ECC engine 114 cannot correct the error, the data stored in this page and the pages following this page will all be discarded. In this case, because another portion of predetermined data DATA is stored in the second buffer Buffer_2 and the status of this portion of data is still valid, a data management error will occur.

Therefore, to avoid the problems as discussed above, when the controller 110A/110B determines that the predetermined data DATA has to be written into different buffers, or when the controller 110A/110B determines that the predetermined data DATA has to be discontinuously written into the first buffer Buffer_1, the controller 110A/110B writes a portion of the predetermined data that has been written in one or more predetermined pages of the first buffer Buffer_1 into the backup memory block Backup_Blk, so that the damaged data can still be recovered. As discussed above, in an embodiment of the invention, the conditions for the controller 110A/110B to determine that the predetermined data DATA of the same write command WCMD has to be written into different buffers may comprise, for example, writing a first portion of the predetermined data DATA into the first buffer Buffer_1, then writing a second portion of the predetermined data DATA into the second buffer Buffer_2, and then writing a third portion of the predetermined data DATA into the first buffer Buffer_1 again. The embodiments are discussed in more detailed in the following paragraphs.

Figure 2:
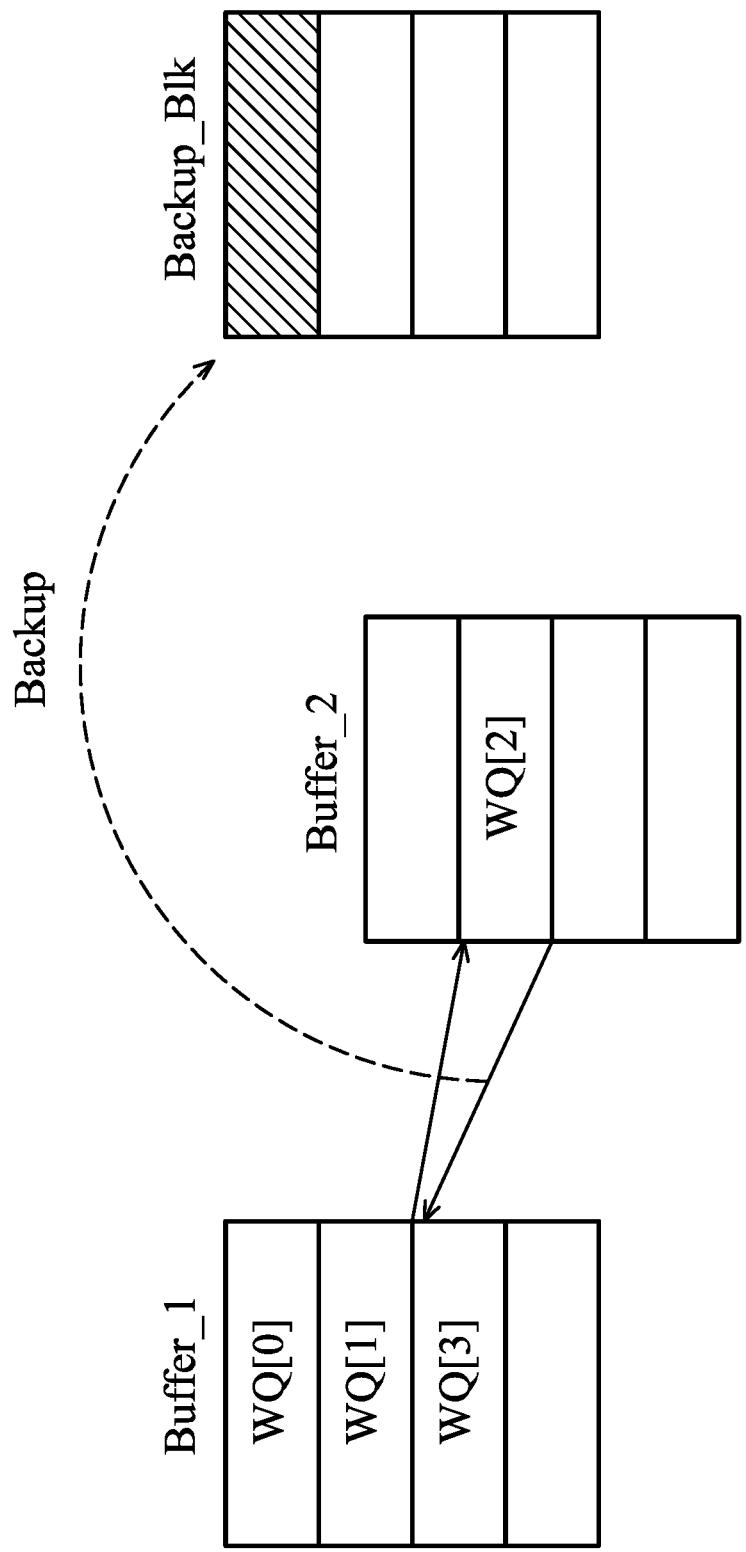
FIG. 2 is a schematic diagram showing how the controller writes the data into the buffers based on a write command according to an embodiment of the invention.

FIG. 2 is a schematic diagram showing how the controller writes the data into the buffers based on a write command according to an embodiment of the invention. According to an embodiment of the invention, the controller 110A/110B arranges the predetermined data DATA into the write queues according to the write command WCMD, so as to generate a plurality of write queues, such as the write queues WQ[0]~WQ[3] shown in FIG. 2. The write queues indicate the data to be written in the memory device. For example, the controller 110A/110B arranges the write task of the host pages HP 0~HP 3 of the predetermined data DATA in the write queue WQ[0], arranges the write task of the host pages HP 4~HP 7 of the predetermined data DATA in the write queue WQ[1], arranges the write task of the host pages HP 8~HP 11 of the predetermined data DATA in the write queue WQ[2], and arranges the write task of the host pages HP 12~HP 15 of the predetermined data DATA in the write queue WQ[3].

It should be noted that the write queues WQ marked in FIG. 2 may correspond to the write task of one or more pages, depending on the amount of data being arranged in the write queue WQ. Therefore, FIG. 2 is merely a schematic diagram of write operations, showing the sequence of the write tasks performed by the controllers 110A/110B and the buffers corresponding to each write task.

According to an embodiment of the invention, when the controller 110A/110B generates the write queues, a data structure may also be established based on the content of the predetermined table, for recording information regarding the logical page address (or, the Logical Block Address (LBA)) of the data processed in each write queue and into which buffer the data should be written.

The controller 110A/110B may perform the corresponding write tasks according to the write queues based on the order of the write queues, so as to complete the write operation of the write command WCMD. For example, the controller 110A/110B performs the write tasks corresponding to the write queues WQ [0], WQ [1], WQ [2], WQ [3] in order. Continuing with the previous example, since the controller 110A/110B learns that the data of host page HP 8 has been stored in the second buffer Buffer_2 by querying the above-described predetermined table, the data arranged to be written in the write queue WQ [2] has to be written into the second buffer Buffer_2 instead of the first buffer Buffer_1.

Therefore, when the controller 110A/110B performs the corresponding write tasks according to the write queues WQ[0], WQ[1], WQ[2] and WQ[3], the data will be written into the first buffer Buffer_1, the first buffer Buffer_1, the second buffer Buffer_2 and the first buffer Buffer_1 in order, so as to complete the corresponding write tasks.

According to an embodiment of the invention, when the controller 110A/110B finishes the write task corresponding to the write queue WQ[2], the controller 110A/110B performs a backup operation, first, so as to write a portion of the predetermined data that has been written in one or more predetermined pages of the first buffer Buffer_1 into the backup memory block Backup_Blk.

Since the controller 110A/110B will program the first buffer Buffer_I again by writing the data into the first buffer Buffer_1 according to the write queue WQ[3] after writing the data into the second buffer Buffer_2 according to the write queue WQ[2], to prevent the data that has been written into the first buffer Buffer_1 according to the write queues WQ[0] and/or WQ[1] from being damaged when a sudden power-off occurs as the controller 110A/110B is programming the first buffer Buffer_1 according to the write queues WQ[3], the controller 110A/110B may back up a portion of the predetermined data that has been written in one or more predetermined pages of the first buffer Buffer_1. In this manner, when the data is damaged due to the sudden power-off, a data recovery task can be performed based on the backup data.

As discussed above, according to an embodiment of the invention, the predetermined pages are the pair pages of the physical pages to be written when performing the write task corresponding to the write queue WQ[3].

Generally, one memory cell of a MLC flash memory stores two bits of data, and these two data bits may respectively belong to a strong page and a weak page which are the pair pages corresponding to each other. The strong page means that the program busy time is relatively short when data is written into this page. The weak page means that the program busy time is relatively long when data is written into this page. Generally, when writing data to the flash memory, the controller sequentially writes each page of the flash memory. Therefore, when the strong page and the weak page of a pair of pages of a multi-level cell flash memory are successively written with data, the data that has already been stored in the strong page may be affected by the write operation of the weak page.

According to an embodiment of the invention, the controller 1110A/110B may determine whether a page (for example, a physical page) to be written with data in the first buffer Buffer_1 is a weak page (also called an upper page). If the page is a weak page, the controller 110A/110B may search a predetermined range in a reverse direction from this page to the pages that have been written with data, so as to pick up the strong page (also called a lower page) corresponding to this weak page, and write a portion of the predetermined data DATA that have been previously written into this strong page into the backup memory block Backup_Blk. Generally, the pairing relationship of the strong page and the weak page may become known when the memory device is being manufactured, or it may be obtained via some specific calculation.

According to an embodiment of the invention, the strong pages that have been picked up may be all the strong pages in the first buffer Buffer_1 that have been written with a portion of the predetermined data corresponding to the write command WCMD, the operation of which has not yet finished. On the other hand, the strong pages that have been picked up may be one or more strong pages in the first buffer Buffer_1 that correspond to one more pages that are going to be written in the following write tasks corresponding to the write command WCMD, though those write tasks have not been performed yet. For example, the strong pages being picked up may be the strong pages corresponding to one more pages in the first buffer Buffer_1 to be written with data in the write task corresponding to the write queue WQ[3].

As discussed above, damage done to the weak page of a pair of pages will generally affect data stored in the corresponding strong page. In order to avoid damaging a strong page along with its pair page (when a sudden power-off occurs while this page is being programmed in a subsequent write operation for performing the same write command WCMD and thereby causing problems such as rendering unrecoverable data that has already been written into the buffer, as described above), the data that has already been written into one or more strong pages of the first buffer Buffer_1 will be written in the backup memory block Backup_Blk in advance, according to the embodiments of the invention. In this manner, when an uncorrectable error occurs due to the effects on the data of a sudden power-off event, the data stored in the backup memory block Backup_Blk can be utilized to perform data recovery.

To be more specific, according to an embodiment of the invention, when the controller 110A/110B finishes the write task corresponding to the write queue WQ[2], the controller 110A/110B performs a corresponding backup operation, so as to write the data that has been previously written in one or more strong pages based on the write queue WQ[0] and/or WQ[1] into the backup memory block Backup_Blk. According to another embodiment of the invention, when the controller 110A/110B finishes the write task corresponding to the write queue WQ[2], the controller 110A/110B performs a corresponding backup operation, so as to write the data that has been previously written in one or more strong pages in the first buffer Buffer_1, which are the strong pages corresponding to one or more pages planned to be written based on the write queue WQ[3], into the backup memory block Backup_Blk.

For example, suppose that the fifth page of the first buffer Buffer_1 which is planned to be written with data based on the write queue WQ[3] is a weak page, and the pair page of the fifth page is the third page, which is a strong page, the controller 110A/110B may write the data stored in the third page into the backup memory block Backup_Blk after the write task corresponding to the write queue WQ[2] has been finished.

After the backup operation, the controller 110A/110B will keep performing the unfinished write task corresponding to the write queue WQ[3], so as to finish all the write tasks corresponding to the write command WCMD.

Figure 3:
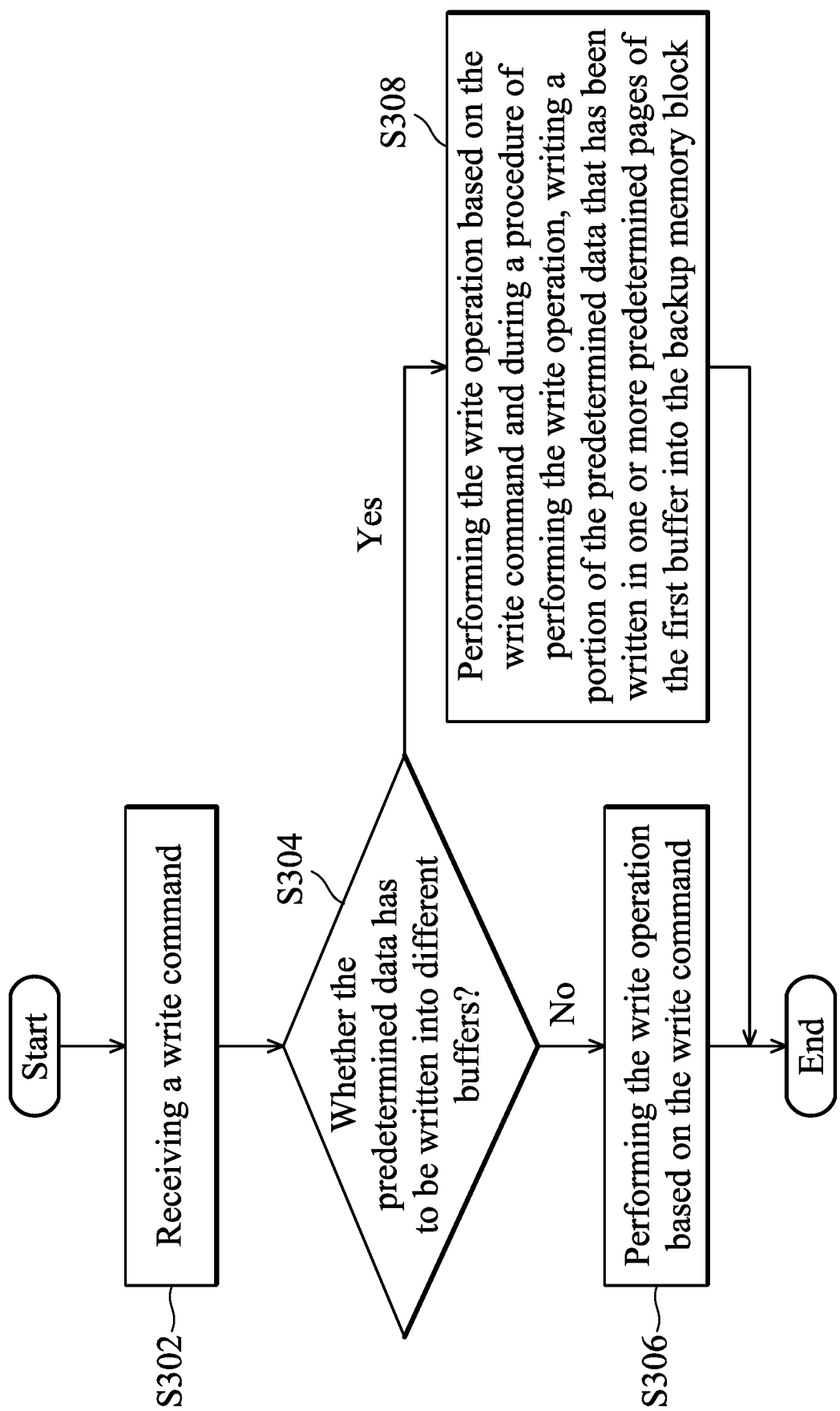
FIG. 3 shows an exemplary flow chart of a method for writing data into a memory device according to an embodiment of the invention.

FIG. 3 shows an exemplary flow chart of a method for writing data into a memory device according to an embodiment of the invention. First of all, a write command to write predetermined data in the memory device is received (step S302). Next, whether the predetermined data has to be written into different buffers or has to be written into the first buffer discontinuously is determined (step S304). If not, the write operation is directly performed based on the write command, so as to write the predetermined data into the memory device (step S306). If so, the write operation is performed based on the write command, so as to write the predetermined data into the memory device. However, during the write operation, a portion of the predetermined data that has been written in one or more predetermined pages of the first buffer is written into the backup memory block (step S308). How to use the backup data is discussed further in the following paragraphs.

When a sudden power-off has occurred in the data storage device, a Sudden Power-off Recovery (SPOR) procedure will be performed after the system is powered up again. This is performed to check the data errors and then re-establish the tables and the links for data blocks. Therefore, while performing the SPOR procedure, the controller 110A/110B will check whether any errors have occurred in the data stored in the buffer. When there is no error in the data, or the errors can be corrected by the ECC engine 114, the tables and the data block links can be re-established. However, when the controller 110A/110B finds an unrecoverable error, the corresponding memory block is deemed as a damaged memory block. At this time, the valid data in this memory block has to be moved to another memory block, so as to avoid further damaging the data that will be written in the following write operations.

In an embodiment of the invention, since the controller 110A/110B has already backed up the data stored in the strong page(s) that is most possibly being damaged during the write operation, there is no need to discard all the predetermined data DATA corresponding to the write command WCMD just because a portion of the data is damaged. The backup data can be utilized to reorganize the predetermined data DATA and to help move the predetermined data DATA to another memory block.

Figure 4:
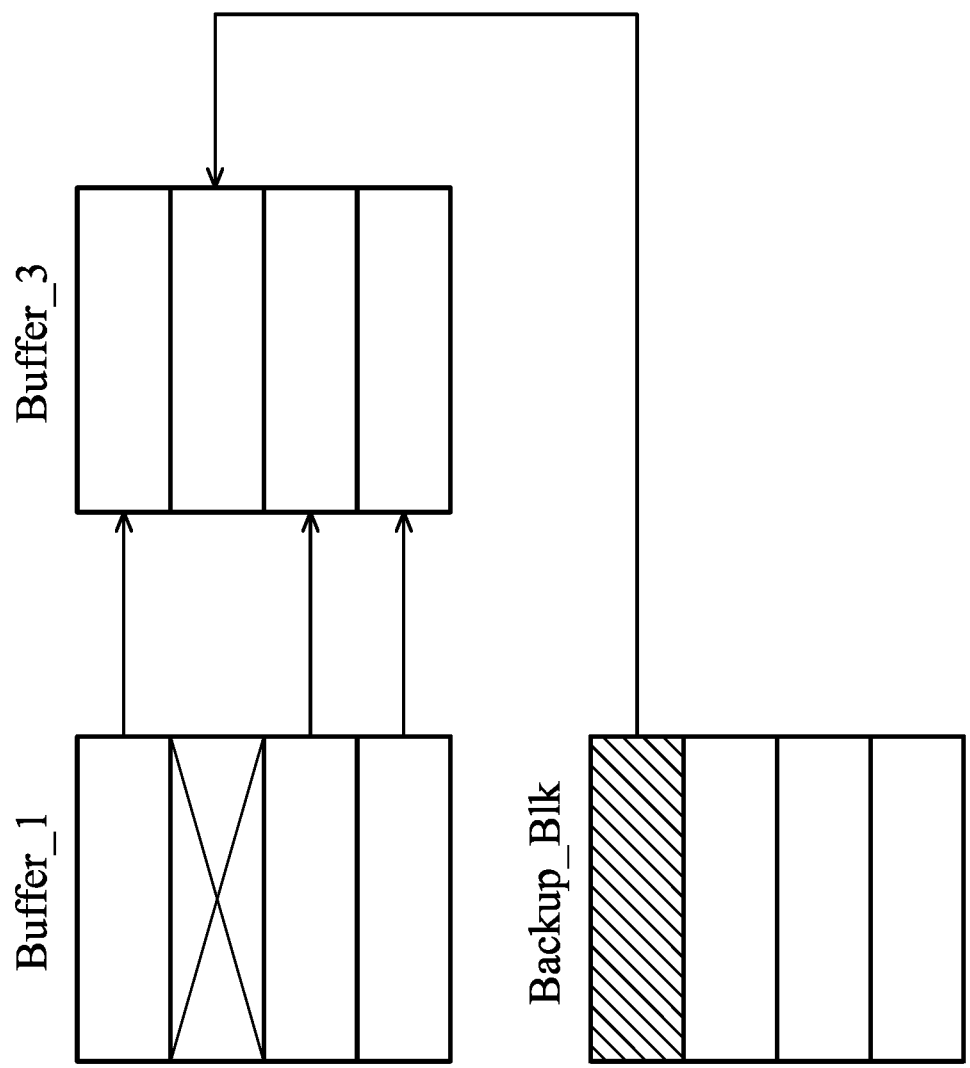
FIG. 4 is a schematic diagram showing the procedure of moving the data from the damaged memory block to another memory block according to an embodiment of the invention.

FIG. 4 is a schematic diagram showing the procedure of moving data from a damaged memory block to another memory block according to an embodiment of the invention. Suppose that an uncorrectable error has occurred in the second page of the first buffer Buffer_1: the controller 110A/110B may mark the memory block corresponding to the first buffer Buffer_1 as a damaged memory block, and decide to move the data stored in the first buffer Buffer_1 to another memory block, such as the buffer Buffer_3, to avoid further damaging the data that will be written in the following write operations.

During the procedure of moving the data, since the second page of the first buffer Buffer_1 has been damaged, the controller 110A/110B reads the backup data corresponding to that page from the backup memory block Backup_Blk, and writes the data into the buffer Buffer_3. In this manner, there is no need to discard all the predetermined data DATA just because a portion of data is damaged.

In summary, in the embodiments of the invention, the data that has been written into one or more strong pages in the first buffer Buffer_1 is written in the backup memory block Backup_Blk in advance. This technique offers a solution to the problem of a strong page being damaged due to damage occurring to its pair page when a sudden power-off occurs while this page is being programmed in a subsequent write operation for performing the same write command WCMD, which makes data that has already been written into the buffer unrecoverable. In addition, when an uncorrectable error occurs due to a sudden power-off event, the data stored in the backup memory block Backup_Blk will be utilized for data recovery. In this manner, there is no need to discard all the predetermined data DATA just because a portion of the data is damaged, and the access performance of the memory device will not be degraded due to discarding of the data.

The term "coupled" in the specification of the invention generally refers to various direct or indirect electrical connections. While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:
1. A data storage device, comprising:
a memory device, comprising a first buffer, a second buffer and a backup memory block, wherein the first buffer is a multi-level cell (MLC) block and the second buffer is a single-level cell (SLC) block; and
a controller, coupled to the memory device, and configured to receive a write command to write predetermined data in the memory device and determine whether the predetermined data has to be written into different buffers,
wherein when the controller determines that the predetermined data has to be written into different buffers, the controller is configured to write a portion of the predetermined data that has been written in one or more predetermined pages of the first buffer into the backup memory block,
wherein the predetermined data comprises a plurality of pages, the controller determines whether the predetermined data has to be written into different buffers based on size of the predetermined data and whether at least one page of the predetermined data has been stored in the second buffer, and when the size of the predetermined data is greater than a threshold value and at least one page of the predetermined data has been stored in the second buffer, the controller determines that the predetermined data has to be written into different buffers.

2. The data storage device as claimed in claim 1, wherein the controller generates a plurality of write queues according to the write command, the write queues comprise at least a first write queue, a second write queue and a third write queue, the first write queue indicates a first portion of data to be written into the first buffer, the second write queue indicates a second portion of data to be written into the second buffer, the third write queue indicates a third portion of data to be written into the first buffer, the controller executes the write command based on the first write queue, the second write queue and the third write queue, sequentially, and wherein before the controller performs a corresponding write task based on the third write queue, the controller is configured to write the data in the first portion of data that has been written in the one or more predetermined pages of the first buffer into the backup memory block.

3. The data storage device as claimed in claim 2, wherein the one or more predetermined pages are the strong pages of the first buffer.

4. A data storage device, comprising:
a memory device, comprising a first buffer, a second buffer and a backup memory block, wherein the first buffer is a multi-level cell (MLC) block and the second buffer is a single-level cell (SLC) block; and
a controller, coupled to the memory device, and configured to receive a write command to write predetermined data in the memory device and determine whether the predetermined data has to be written into the first buffer discontinuously,
wherein when the controller determines that the predetermined data has to be written into the first buffer discontinuously, the controller is configured to write a portion of the predetermined data that has been written in one or more predetermined pages of the first buffer into the backup memory block,
wherein the predetermined data comprises a plurality of pages, the controller determines whether the predetermined data has to be written into first buffer discontinuously based on size of the predetermined data and whether at least one page of the predetermined data has been stored in the second buffer, and when the size of the predetermined data is greater than a threshold value and at least one page of the predetermined data has been stored in the second buffer, the controller determines that the predetermined data has to be written into the first buffer discontinuously.

5. The data storage device as claimed in claim 4, wherein the controller generates a plurality of write queues according to the write command, the write queues comprise at least a first write queue, a second write queue and a third write queue, the first write queue indicates a first portion of data to be written into the first buffer, the second write queue indicates a second portion of data to be written into the second buffer, the third write queue indicates a third portion of data to be written into the first buffer, the controller executes the write command based on the first write queue, the second write queue and the third write queue, sequentially, and wherein before the controller performs a corresponding write task based on the third write queue, the controller is configured to write the data in the first portion of data that has been written in the one or more predetermined pages of the first buffer into the backup memory block.

6. The data storage device as claimed in claim 5, wherein the one or more predetermined pages are the strong pages of the first buffer.

7. A method for writing data into a memory device, suitable for a data storage device comprising a memory device and a controller, wherein the memory device comprises a first buffer, a second buffer and a backup memory block, the first buffer is a multi-level cell (MLC) block and the second buffer is a single-level cell (SLC) block, the method comprising:
performing a write operation based on a write command to write predetermined data in the memory device,
wherein the step of performing the write operation based on the write command further comprises:
during the write operation, writing a portion of the predetermined data that has been written in one or more predetermined pages of the first buffer into the backup memory block,
wherein the method further comprises:
determining whether the predetermined data has to be written into different buffers,
wherein when it is determined that the predetermined data has to be written into different buffers, writing the portion of the predetermined data that has been written in the one or more predetermined pages of the first buffer into the backup memory block,
wherein the predetermined data comprises a plurality of pages, and when size of the predetermined data is greater than a threshold value and at least one page of the predetermined data has been stored in the second buffer, it is determined that the predetermined data has to be written into different buffers.

8. The method as claimed in claim 7, further comprising:
determining whether the predetermined data has to be written into the first buffer discontinuously,
wherein when it is determined that the predetermined data has to be written into the first buffer discontinuously, writing the portion of the predetermined data that has been written in the one or more predetermined pages of the first buffer into the backup memory block.

9. The method as claimed in claim 8, wherein the predetermined data comprises a plurality of pages, and when the size of the predetermined data is greater than a threshold value and at least one page of the predetermined data has been stored in the second buffer, it is determined that the predetermined data has to be written into the first buffer discontinuously.

10. The method as claimed in claim 7, wherein the step of performing the write operation based on the write command further comprises:
generating a plurality of write queues according to the write command, wherein the write queues comprise at least a first write queue, a second write queue and a third write queue, the first write queue indicates a first portion of data to be written into the first buffer, the second write queue indicates a second portion of data to be written into the second buffer, the third write queue indicates a third portion of data to be written into the first buffer;
performing corresponding write tasks based on the first write queue and the second write queue;
after the write task corresponding to the second write queue has been finished, writing the data in the first portion of data that has been written in the one or more predetermined pages of the first buffer into the backup memory block; and
performing a corresponding write task based on the third write queue.

11. The method as claimed in claim 7, wherein the one or more predetermined pages are the strong pages of the first buffer.

* * * * *